(12) United States Patent
Liu

(10) Patent No.: US 11,829,078 B2
(45) Date of Patent: Nov. 28, 2023

(54) OVERLAY MEASURING APPARATUS

(71) Applicant: NANYA TECHNOLOGY CORPORATION, New Taipei (TW)

(72) Inventor: Chien-Hsien Liu, Taichung (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 28 days.

(21) Appl. No.: 17/680,514

(22) Filed: Feb. 25, 2022

(65) Prior Publication Data

US 2023/0273530 A1    Aug. 31, 2023

(51) Int. Cl.
*G03F 9/00*    (2006.01)
*G03F 7/00*    (2006.01)

(52) U.S. Cl.
CPC ........ *G03F 7/70633* (2013.01); *G03F 9/7088* (2013.01)

(58) Field of Classification Search
CPC ............... G03F 7/70633; G03F 9/7088; G02B 27/4255
See application file for complete search history.

(56) References Cited

U.S. PATENT DOCUMENTS

| | | | | |
|---|---|---|---|---|
| 10,990,023 | B1* | 4/2021 | Hsieh | G03F 7/70633 |
| 2014/0264961 | A1* | 9/2014 | Huang | G03F 7/70633 |
| | | | | 257/797 |
| 2018/0217509 | A1* | 8/2018 | Stiepan | G03F 7/705 |
| 2021/0312656 | A1* | 10/2021 | Eyring | G03F 7/70616 |

FOREIGN PATENT DOCUMENTS

| | | | | |
|---|---|---|---|---|
| TW | 202122934 A | 6/2021 | | |
| TW | 202134797 A | 9/2021 | | |
| TW | 202146889 A | 12/2021 | | |
| WO | WO-2021089319 A1 * | 5/2021 | ......... | G03F 7/70625 |

OTHER PUBLICATIONS

Office Action dated Dec. 27, 2022 related to Taiwanese Application No. 111118087.

* cited by examiner

*Primary Examiner* — Peter B Kim
(74) *Attorney, Agent, or Firm* — Xuan Zhang

(57) ABSTRACT

The present application provides an overlay measuring apparatus, adapted to determine relative positions of two or more successive patterned layers of a device. The overlay measuring apparatus includes a stage and an imaging assembly. The device is placed on the stage. The imaging assembly includes a plurality of optical heads and a plurality of overlay marks assembled on the optical heads. The relative positions of the two or more successive patterned layers of the device are determined using light reflected from the device and passing through the overlay mark mounted on the respective optical head.

22 Claims, 14 Drawing Sheets

124

124

124

124

124

124

124

124

124

124

124

124

124

124

OVERLAY MEASURING APPARATUS

TECHNICAL FIELD

The present disclosure relates to an overlay measurement technique, which is used in semiconductor manufacturing processes, and more particularly, to an overlay mark for measuring an alignment error between different layers, or between different patterns on a same layer, of a semiconductor wafer stack.

DISCUSSION OF THE BACKGROUND

Semiconductor devices such as memory devices are typically fabricated by a sequence of processing steps applied to a specimen. Various features and multiple structural levels of the semiconductor devices are formed by such processing steps. For example, lithography, among others, is one semiconductor fabrication process that involves generating a pattern on a semiconductor wafer. Additional examples of semiconductor fabrication processes include, but are not limited to, ion implantation (doping), deposition, etching, metallization, oxidation, and chemical-mechanical polishing. Multiple semiconductor devices may be fabricated on a single semiconductor wafer and then separated into individual semiconductor devices by a technique such as dicing or sawing.

Semiconductor devices are often fabricated by depositing a series of layers on a substrate. Some or all of the layers include various patterned structures. Relative positions of the structures both within a layer and between layers is critical to performance of completed electronic devices. Overlay refers to the relative position of overlying or interlaced structures on a same or different layers of a wafer. Overlay error refers to deviations from a nominal relative position of overlying or interlaced structures. A greater overlay error leads to greater misalignment of the structures. If the overlay error is too great, the performance of the manufactured electronic device may be compromised.

Image-based overlay (IBO) measurement is a very common technique used in integrated circuit manufacturing to extract overlay error values. The overlay error is measured using dedicated overlay targets, which are optimized to increase accuracy and resolution of the overlay. However, the dedicated overlay targets are much larger than product features of the integrated circuit. The IBO measurement is based on the dedicated targets instead of on the product features, because the current overlay metrology solutions, mainly based on optics, cannot provide sufficient resolution using the product features.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides an overlay measuring apparatus for determining relative positions of two or more successive patterned layers of a device. The overlay measuring apparatus includes a stage and an imaging assembly configured to record images of the device placed on the stage. The imaging assembly includes a plurality of optical heads configured to capture the images of the device and a plurality of overlay marks assembled on the plurality of optical heads, respectively. The relative positions of the two or more successive patterned layers of the device are determined using light reflected from the device and passing through the respective overlay mark mounted on the optical head.

In some embodiments, the overlay measuring apparatus further includes a computer configured to execute algorithms that calculate a relative displacement between the successive patterned layers using electrical signals transferred from the image captured by the optical head.

In some embodiments, the computer analyzes a difference between a predetermined intensity distribution of light reflected by the device and a unique intensity distribution of the light reflected by the device and passing through the respective overlay mark to obtain the relative displacement of the patterned layers of the device.

In some embodiments, the computer is configured to control a movement of the stage, and is further configured to select the optical head to record the image.

In some embodiments, the imaging assembly further includes a light source configured to generate light to illuminate the device.

In some embodiments, the imaging assembly further includes a beam splitter disposed at an intersection of axes of the light source and the optical head, wherein the beam splitter reflects the light generated from the light source, and the light reflected from the device passes through the beam splitter and the respective overlay mark and is incident on the respective optical head.

In some embodiments, the overlay measuring apparatus further includes a first lens and a second lens, wherein the first lens is disposed between the beam splitter and the device, and the second lens is disposed between the beam splitter and the optical head.

In some embodiments, the overlay mark comprises a plurality of micro-structures arranged in a concentric configuration.

In some embodiments, the micro-structures include circles.

In some embodiments, the micro-structures include squares.

In some embodiments, the micro-structures further include two lines intersecting at a center of the squares and dividing the squares into quarters.

In some embodiments, the micro-structures include rhombuses.

In some embodiments, the micro-structures further comprise four lines extending outward from centers of sides of an outmost one of the rhombuses.

In some embodiments, the micro-structures further include a plurality of lines spaced apart from an outermost one of the rhombuses with a first pitch greater than a second pitch between two of the rhombuses adjacent to each other.

In some embodiments, the overlay mark is composed of repetitious micro-structures.

In some embodiments, the overlay mark is a rhombus and is composed of a plurality of rhomboidal micro-structures.

In some embodiments, the micro-structures are rectangular and are arranged in a running bond configuration.

In some embodiments, the overlay mark includes rhomboidal or hexagonal micro-structures.

In some embodiments, the micro-structures have a gammadion shape.

In some embodiments, the overlay mark includes a plurality of trapezoidal micro-structures and a plurality of inverted trapezoidal micro-structures alternately interlaced with each other.

In some embodiments, the overlay mark includes zigzag micro-structures.

In some embodiments, the overlay mark comprises multiple overlapping square micro-structures, and each of the overlapping square micro-structures is composed of four small squares.

In some embodiments, the overlay measuring apparatus further includes a passivation film covering the plurality of overlay marks.

One aspect of the present disclosure provides an optical system. The optical system comprises a device and an overlay measuring apparatus. The device includes a first patterned layer, a second patterned layer and a first passivation film. The second patterned layer is disposed above the first patterned layer, and the first passivation film covers the first patterned layer. The overlay measuring apparatus for determining relative position of first and second patterned layers includes a stage and an imaging assembly. The device is placed on the stage. The imaging assembly comprises a plurality of optical heads and a plurality of overlay marks. The plurality of optical heads are configured to record at least one image of the device. The plurality of overlay marks are assembled on the plurality of optical heads, respectively. The relative position of the first and second patterned layers are determined using light reflected from the device and passing through the respective overlay mark mounted on the optical head.

In some embodiments, the device further includes a second passivation film covering the second patterned layer.

In some embodiments, the device further includes at least one semiconductor layer disposed between the first passivation film and the second patterned layer, and the second patterned layer is configured to pattern the semiconductor layer during etching.

In some embodiments, the overlay measuring apparatus further includes a computer configured to execute algorithms that calculate a relative displacement of the first and second patterned layers using electrical signals transferred from the image recorded by the optical head.

In some embodiments, wherein the overlay mark comprises a plurality of micro-structures arranged in a concentric configuration.

In some embodiments, the overlay mark is composed of repetitious micro-structures.

One aspect of the present disclosure provides a method of operating an overlay measuring apparatus. The method includes steps of providing a plurality of optical heads; assembling a plurality of overlay marks on the plurality of optical heads; placing a device to be measured on a stage; aligning one of the plurality of optical heads with the device; and recording at least one image of the device.

In some embodiments, the method further includes a step of calculating a relative displacement of patterns on the device based on the at least one image.

In some embodiments, the calculation is performed by a computer electrically coupled to the imaging assembly.

In some embodiments, the computer is electrically coupled to the stage to control a movement of the stage.

In some embodiments, the method further includes a step of providing a light source to illuminate the device.

In some embodiments, the method further includes providing a beam splitter and positioning the beam splitter at an intersection of optical axes of the light source and the optical head for recording the image of the device.

In some embodiments, the overlay mark comprises a periodic structure.

With the above-mentioned configurations of the overlay measuring apparatus, the test pattern of the overlay mark is mounted on the optical head and is replaceable during the measurement; therefore, the recorded image may have a better resolution, and thus an accuracy of the measurement is improved.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
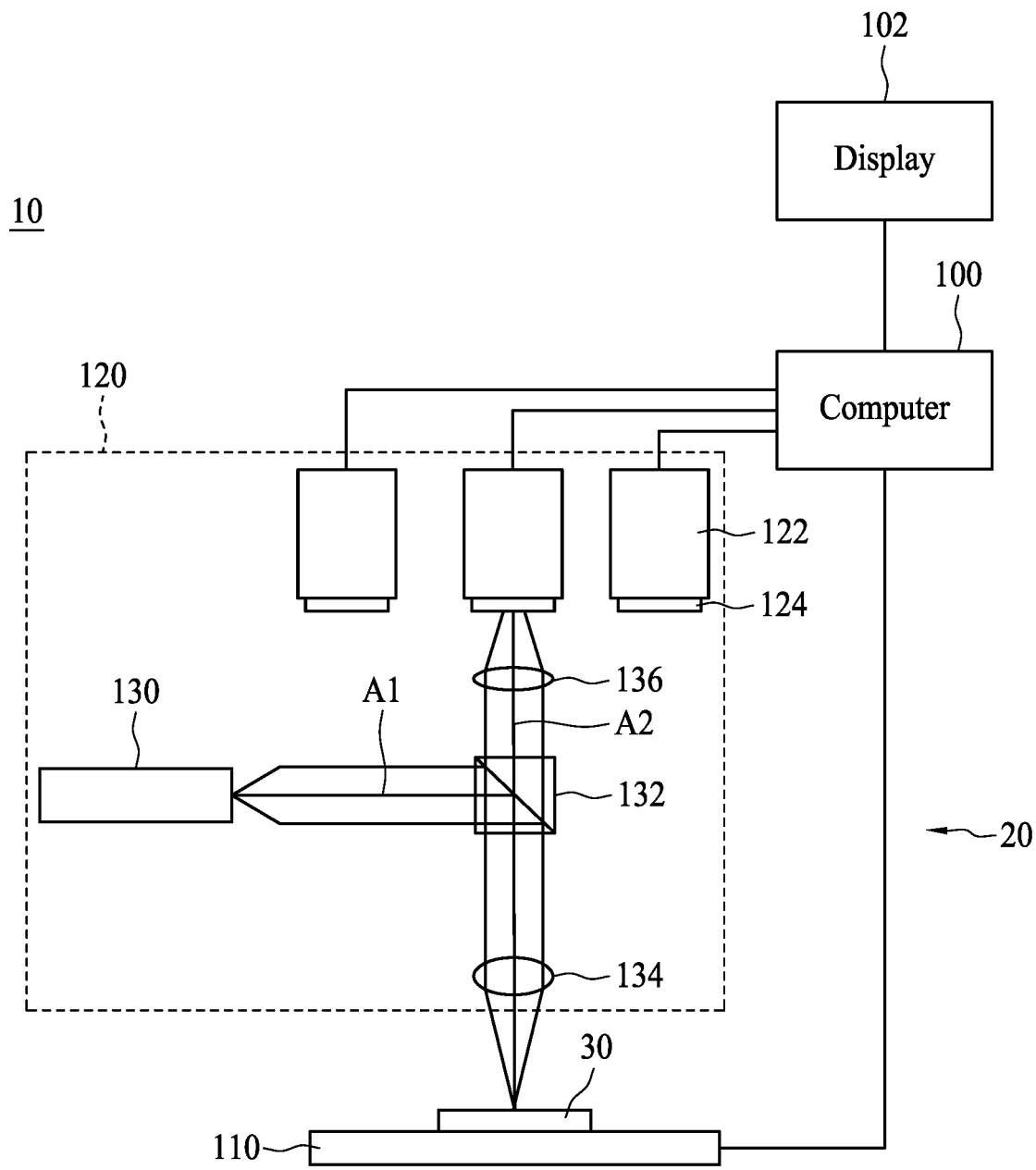
FIG. 1 is a schematic view of an optical system in accordance with some embodiments of the present disclosure.

Embodiments, or examples, of the disclosure illustrated in the drawings are described below using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
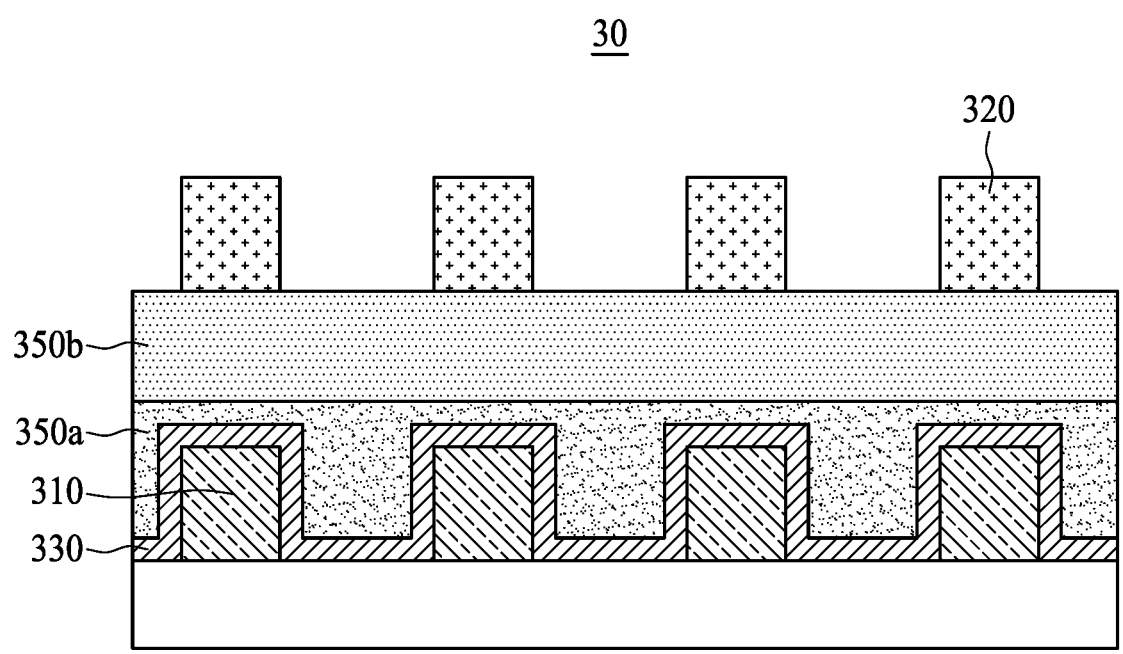
FIG. 2 is a cross-sectional view of a device in accordance with some embodiments of the present disclosure.

FIG. 1 is a schematic view of an optical system 10 in accordance with some embodiments of the present disclosure. Referring to FIG. 1, the optical system 10 includes an overlay measuring apparatus 20 and a device 30. The overlay measuring apparatus 20 is used to provide information of overlay between different layers or between different patterns on a same layer of the device 30. More particularly, the overlay measuring apparatus 20 is used in semiconductor manufacturing processes and used to determine how accurately a first patterned layer 310 (as shown in FIG. 2) of the device 30 aligns with a second patterned layer 320 disposed above or below the first patterned layer 310. Alternatively, the overlay measuring apparatus 20 may be employed to determine how accurately a first pattern on the device 30 aligns with a second pattern on the device 30 disposed on the same layer. The device 30 may include various elements, such as semiconductor components, bipolar junction transistor, resistors, capacitors, diodes, fuses, etc., but is simplified for a better understanding of the concepts of the present disclosure.

Referring to FIGS. 1 and 2, the overlay measuring apparatus 20, configured to determine a relative shift between the first and second patterned layers 310 and 320 of the device 30, mainly includes a stage 110 capable of horizontal motion and vertical motion and an imaging assembly 120 used to record images of the device 30 placed on the stage 110. In some embodiments, the stage 110 is movable in either Cartesian coordinates or polar coordinates.

The imaging assembly 120 includes a plurality of optical heads 122 employed to capture the images of the device 30 for integrated circuits and a plurality of overlay marks 124 assembled on the optical heads 122. The overlay marks 124, mounted on the optical heads 122, have test patterns. Notably, the overlay marks 124, used to monitor overlay deviation between the first and second patterned layers 310 and 320 of the device 30, are optically transparent and allow light to pass through without appreciable scattering of the light.

The optical head 122, right above the device 30, can receive light reflecting off the device 30 and passing through the respective overlay mark 124, and can transform the light with a unique intensity distribution into corresponding electrical signals, which are sent to a computer 100 and which can be used by the computer 100. In some embodiments, the computer 100 includes a standardized operation system capable of running general-purpose application software for assisting with analysis of process performance data and for communicating with the stage 110 and the optical head 122 via communication ports thereof. The computer 100 may monitor the status of the imaging assembly 120, and then provide instructions to the imaging assembly 120 based on the monitoring results.

After receiving the electrical signals, the computer 100 executes analysis algorithms that calculate a relative displacement of the first and second patterned layers 310 and 320 of the device 30 based on the captured image(s). Information associated with conditions measured by the optical head 122 is transmitted to the computer 100, which executes real-time and/or post-measurement analysis to predict a quality of the device 30.

Generally, the light reflected by the device 30 has a predetermined intensity distribution, and the light reflecting by the device 30 and passing through the test patterns of the overlay mark 124 has the unique intensity distribution; the computer 100 may analyze the difference between the predetermined intensity distribution and the unique intensity distribution to obtain the relative displacement of the first and second patterned layers 310 and 320 of the device 30. In some embodiments, the predetermined intensity distribution may be computed or simulated from a parameterized mathematical model. Alternatively, if overlay marks 124 are detachable, the optical head 122 where the overlay mark 124 is not assembled can receive light directly reflecting off the device 30, and can transform the light with the predetermined intensity distribution into corresponding electrical signals. The electrical signals are sent to the computer 100 and can be used by the computer 100.

The computer 100 is, for example, a workstation, a personal computer or a central processing unit. In some embodiments, the computer 100 is not only electrically coupled to the optical head 122, but also electrically connected to the stage 110 for controlling the movement of the stage 110 that holds the device 30. In some embodiments, the computer 100 may be configured to track and store the data related to the recorded image(s) and operations of the stage 110 and the optical heads 122 in a computer readable media. Some common forms of the computer readable media used in the present disclosure may include, for example, floppy disk, flexible disk, hard disk, magnetic tape, any other magnetic medium, compact disc read-only memory (CD-ROM), any other optical medium, punch cards, paper tape, any other physical medium with patterns of holes, random access memory (RAM), programmable read-only memory (PROM), erasable programmable read-only memory (EPROM), flash-EPROM, any other memory chip or cartridge, carrier wave, or any other medium from which a computer is adapted to read.

The test patterns of the overlay marks 124 can include a periodic structure. The test patterns may be composed of a plurality of micro-structures, which increases an amount of information that may be used to measure overlay errors, and which may be widely modified to diminish the impact of certain processes on the overlay measurement. In some embodiments, the micro-structures are about the same size and pitch as structures of actual integrated circuits. By forming each of periodic structures with micro-structures that are sized closer to the size of the actual circuit, a more accurate measurement of any alignment error in such circuit is obtained. The overlay marks 124 may have micro-structures arranged in a concentric configuration, as shown in FIGS. 3 to 9. In alternative embodiments, the overlay marks 124 may be composed of repetitious micro-structures, as shown in FIGS. 10 to 18.

Figure 3:
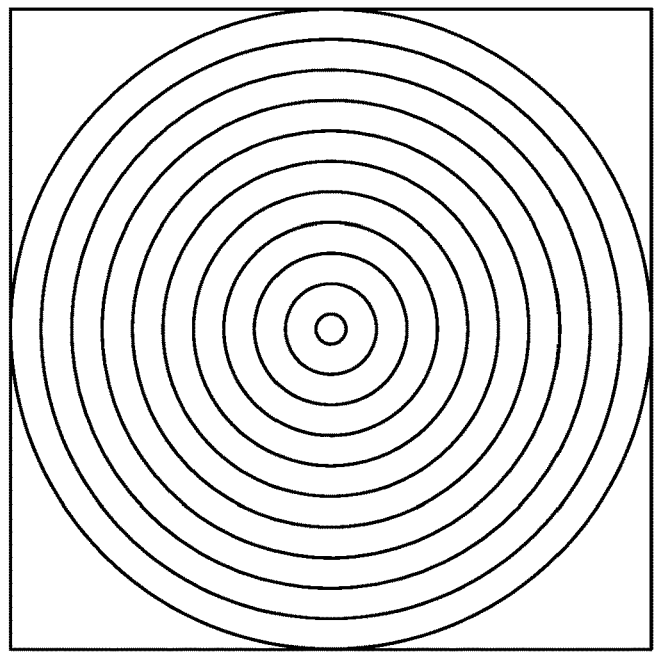
FIGS. 3 to 18 illustrate overlay marks used to determine the alignment of two layers of a semiconductor wafer in accordance with some embodiments of the present disclosure.
Figure 4:
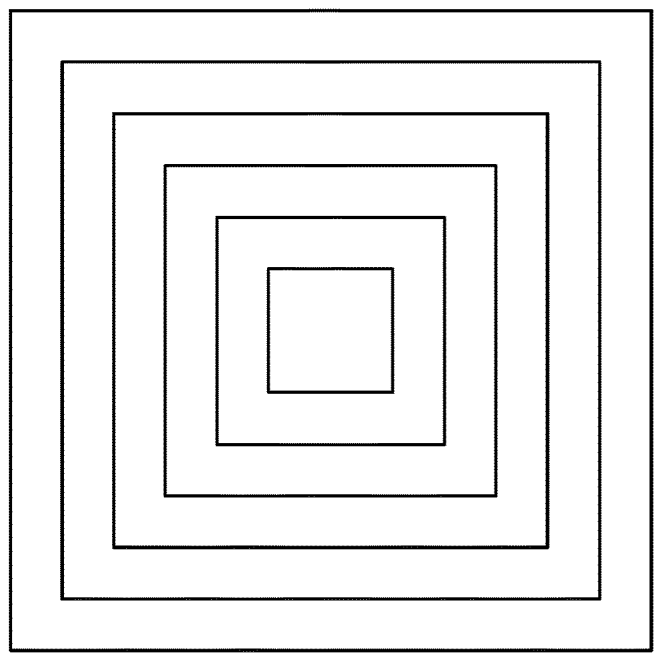
Figure 5:
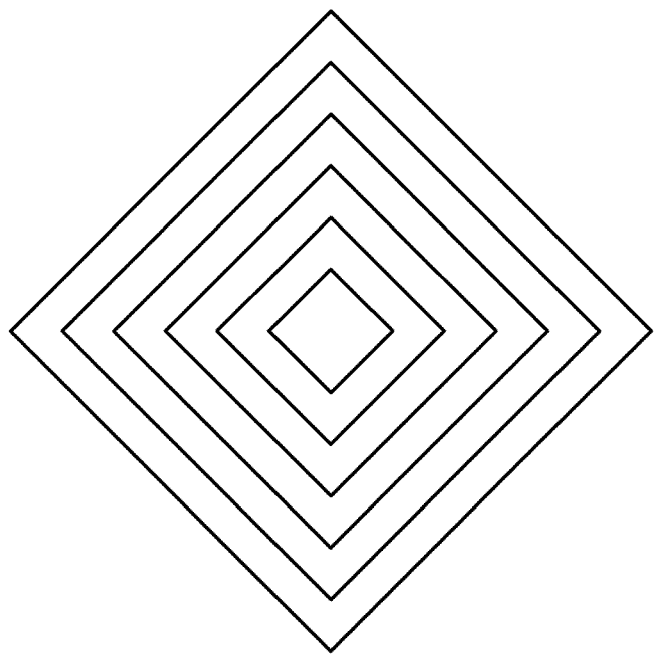
Figure 6:
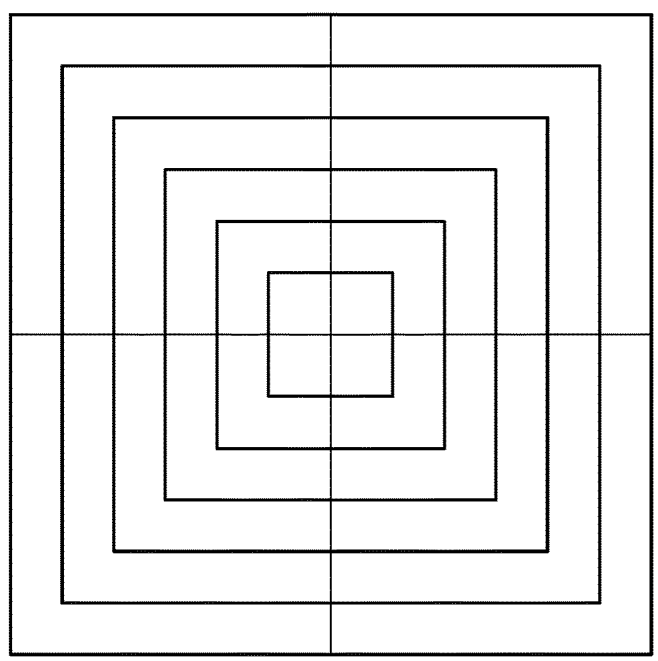
Figure 7:
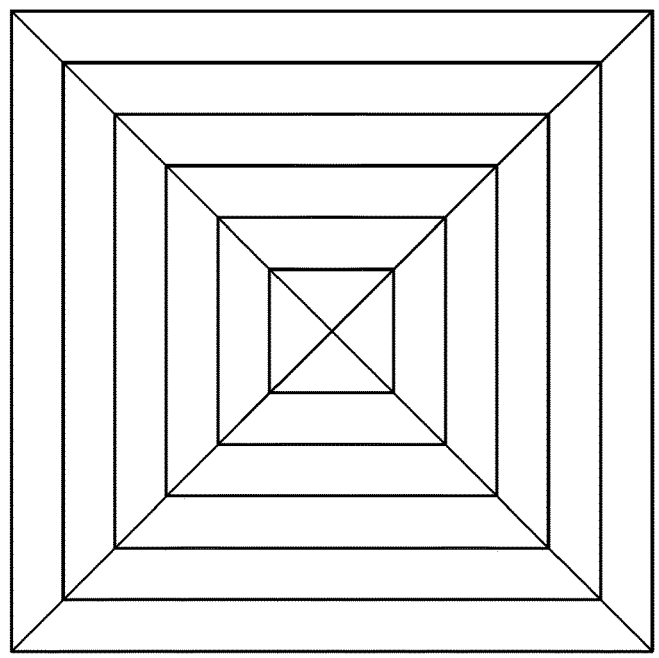

Referring to FIGS. 3 to 5, the micro-structures on the overlay mark 124 are concentric circles, concentric squares, or concentric rhombuses. The overlay mark 124 in FIGS. 6 and 7 includes multiple concentric squares and two lines intersecting at a center of the concentric squares and dividing the concentric squares into quarters; the lines in FIG. 6 cross sides of the squares, while the lines in FIG. 7 are diagonals.

Figure 8:
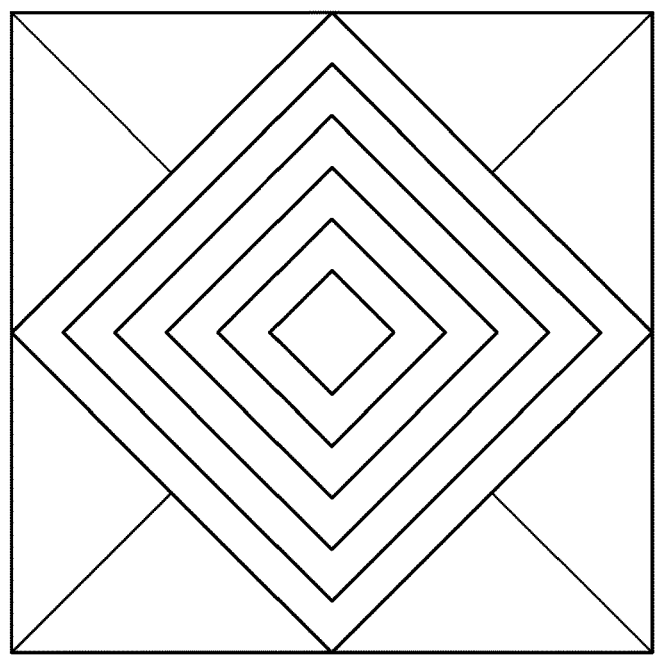
Figure 9:
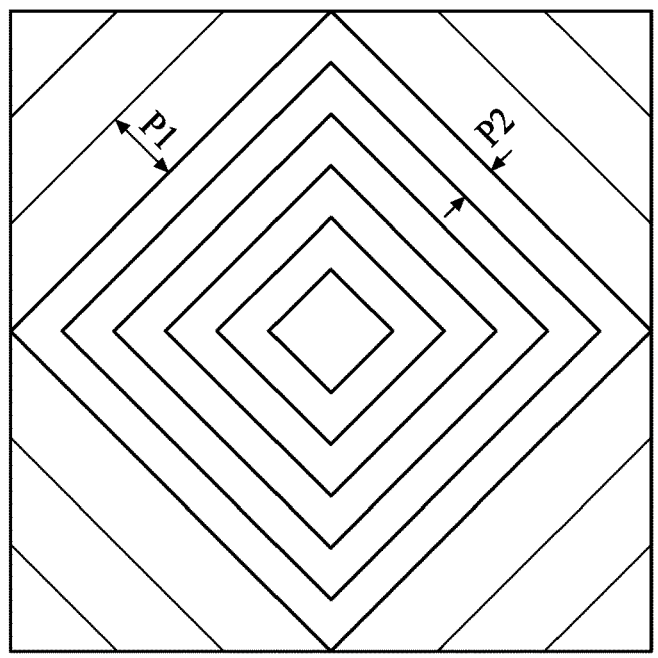

Referring to FIGS. 8 to 9, the micro-structures of the overlay mark 124 include a plurality of concentric rhombuses and a plurality of lines. In detail, the micro-structures in FIG. 8 further include four lines extending outward from centers of sides of outermost rhombuses. In FIG. 9, the micro-structures further include a plurality of lines spaced apart from the outermost rhombuses in a first pitch P1 greater than a second pitch P2 between the concentric rhombuses; the lines are parallel to sides of the concentric rhombuses.

Figure 10:
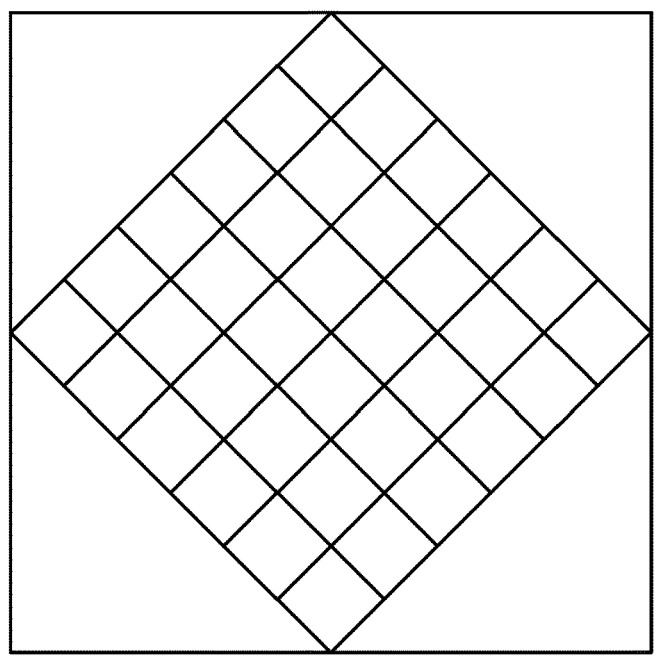
Figure 11:
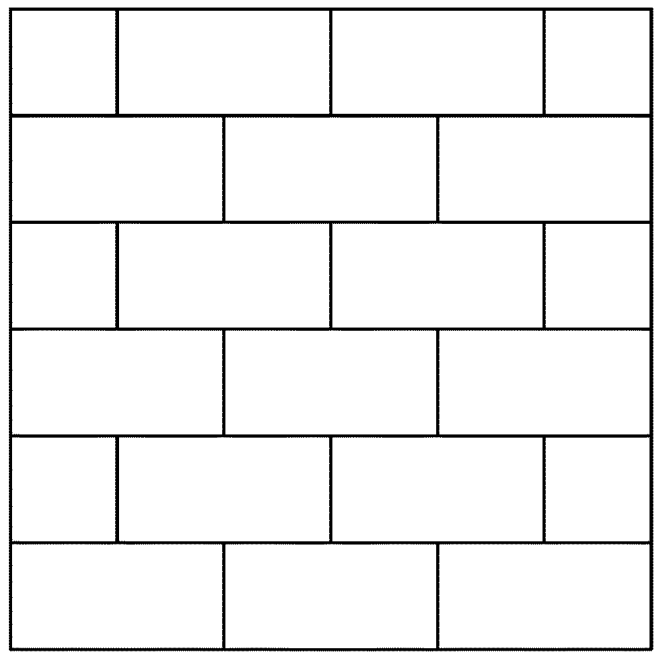
Figure 12:
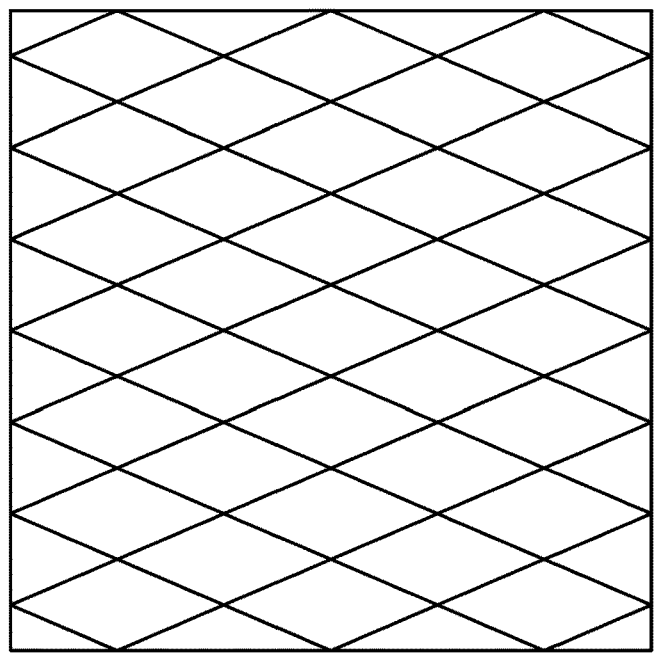
Figure 13:
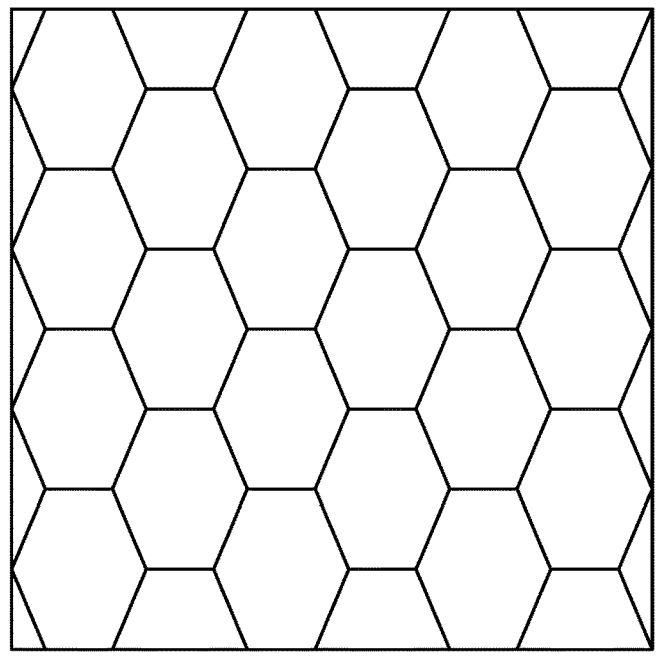

Referring to FIG. 10, the overlay mark 124 is a rhombus and is composed of a plurality of rhomboidal micro-structures. The overlay mark 124 shown in FIG. 11 includes rectangular micro-structures arranged in a running bond configuration. Referring to FIGS. 12 and 13, the overlay marks 124 are composed of repetitive rhomboidal and hexagonal micro-structures, respectively.

Figure 14:
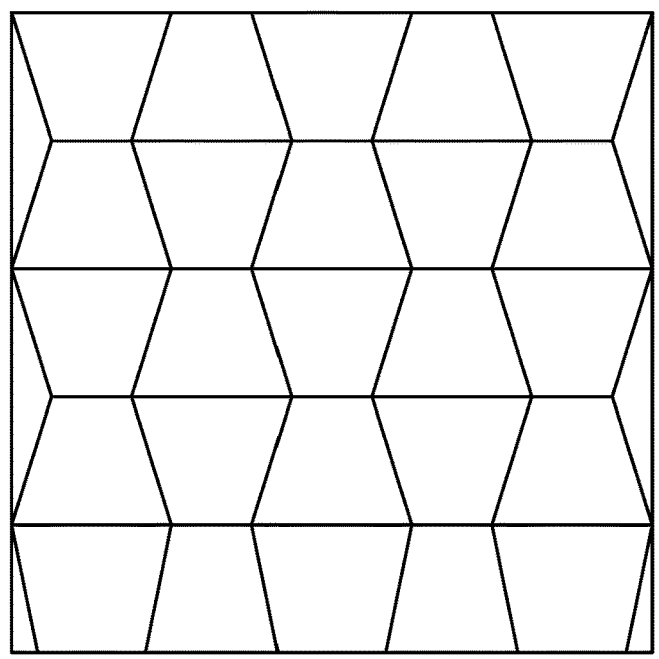
Figure 15:
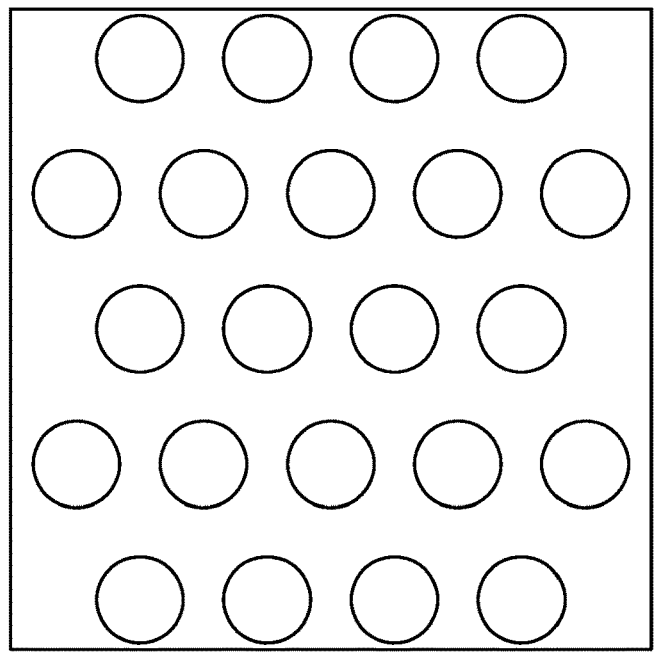
Figure 16:
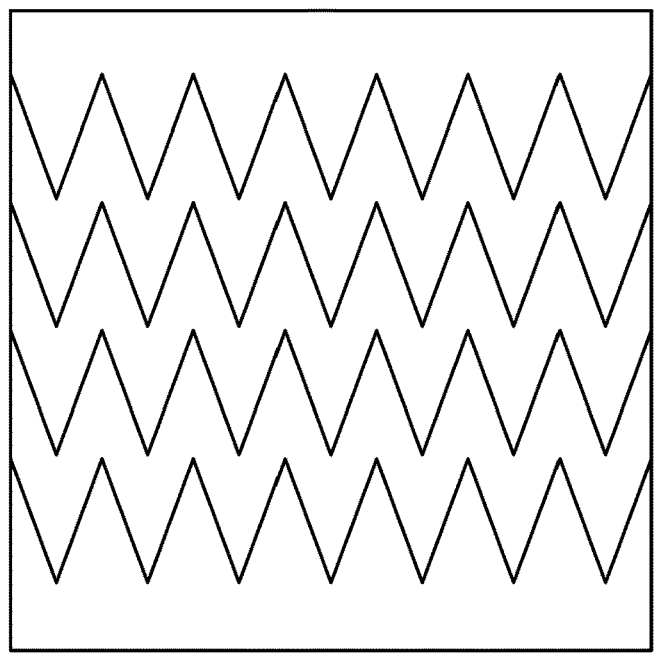
Figure 17:
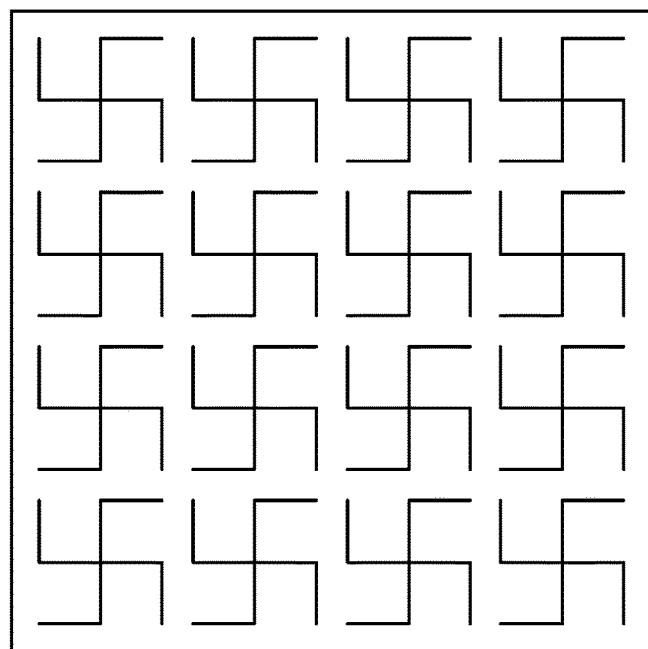
Figure 18:
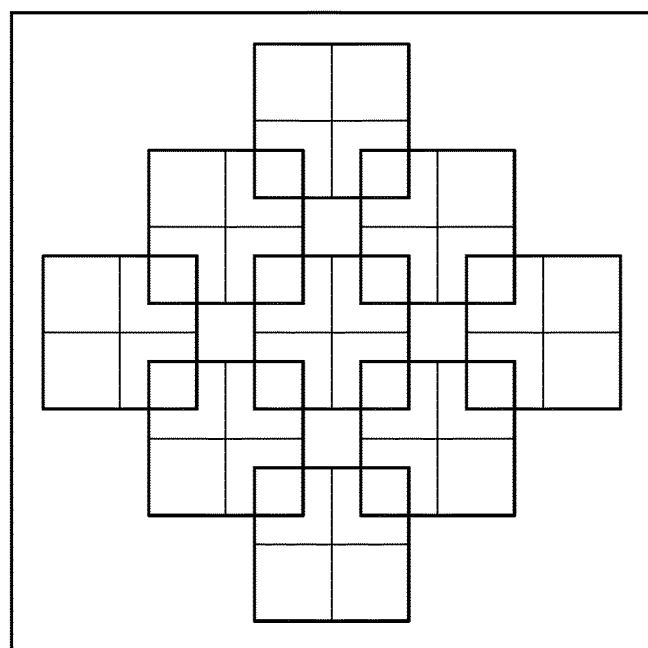

In FIG. 14, the overlay mark 124 includes trapezoidal and inverted trapezoidal micro-structures interlaced with each other. In FIG. 15, the overlay mark 124 includes a plurality of circular micro-structures spaced apart from each other. In FIG. 16, the overlay mark 124 includes zigzag micro-structures. In FIG. 17, the overlay mark 124 includes multiple micro-structures of gammadion (fylfot or swastika) shape. In some embodiments, the gammadion shape is in a right-hand direction. In FIG. 18, the overlay mark 124 includes multiple overlapping square micro-structures composed of four small squares. The overlay marks 124 of the present disclosure are not limited to the above-mentioned embodiments, and may have other different embodiments.

Referring again to FIG. 2, the device 30 may further include a first passivation film 330 disposed between the first patterned layer 310 and the second patterned layer 320. The first passivation film 330, covering the first patterned layer 310, may provide structural strength to the first patterned layer 310, which may need to accommodate compression forces (such as from deposition and/or plating process) and/or shear force (such as from chemical mechanical polishing process). The first passivation film 330 is a conformal layer having a substantially uniform thickness. The first passivation film 330 may be formed on the first patterned layer 310 using a plating process or vapor deposition processes, such as a chemical vapor deposition (CVD) process or a physical vapor deposition (PVD) process prior to the deposition of the second patterned layer 320. In some embodiments, the first passivation film 330 is, for example, a diamond-like carbon (DLC) film or a nanocomposite film.

In some embodiments, the device 30 may further includes one or more semiconductor layers 350a and 350b disposed between the first passivation film 330 and the second patterned layer 320, wherein the first passivation film 330 is formed to cover the first patterned layer 310 prior to the deposition of the semiconductor layers 350a and 350b. The semiconductor layers 350a and 350b are optically transparent, thus allowing the light reflected by the first patterned film 310 to be transmitted through the semiconductor layers 350a and 350b and incident onto the optical head 122.

The optical heads 122 are designed with a proper mechanism to effectively capture light reflected off the device 30. In some embodiments, on-site technicians may charge the overlay marks 124 for measuring the device 30 by mechanically revolving the optical heads 122. Alternatively, the computer 100 may control the revolving of the optical heads 122, and thus the test patterns of the overlay mark 124, for measuring overlay error. By way of example, the optical heads 122 may be charge couple devices (CCDs) or complementary metal-oxide-semiconductor (CMOS) sensors. After the measurement, if the recorded images provided by the optical head 122 do not meet expectations, the on-site technicians may charge the overlay marks 124 and then perform another measurement.

Process conditions such as shadowing and light wavelength can also influence signal quality. Therefore, the imaging assembly 120 further include a light source 130 adapted to emit light to illuminate the device 30. The light source 130 provides light incident on the device 30 to optimize image resolution and to minimize optical aberrations. The light source 130 may be configured to provide illumination of a uniform intensity. The light source 130 can provide light at selective wavelengths, including incoherent or coherent wavelengths. The light for illuminating the device 30 may be generated by electromagnetic radiation, such as laser, light-emitting diode (LED), or broadband radiation. Alternatively, the light may be generated by a bulb. In some embodiments, the light source 130 may be a tunable light source operable to generate light beams with different wavelength to achieve multi-wavelength overlay measurement. Additionally, the light source 130 may generate visible light or invisible light including infrared light, near-infrared (NIR) light or far-infrared (FIR) light.

The overlay measuring apparatus 20 can further include a display 102 for displaying data related to performance and operation of the overlay measuring apparatus 20 to the on-site technicians. The display 102 is further configured to accept input data from the on-site technicians. In other words, the display 102 is provided with a communications link directly to the computer 100 to provide real-time control functions of the overlay measuring apparatus 20 by the on-site technicians, particularly where the on-site technicians' intervention is required.

The overlay measuring apparatus 20 can further include operation interface communication links among the computer 100, the stage 110, the optical heads 124, the light source 130 and other peripheral devices, and a program sequence of operation which renders the operation interface capable of monitoring diagnostic functions of the computer 100, the stage 110, the optical heads 124, and the light source 130; triggering of sound and/or light alarms regarding conditions of the optical heads 124 and the light source 130; receiving of performance data from the optical heads 124; and receiving of input data from one or more input device including the display 102 and a keyboard. The display 102 is also configured to display a measurement result of the overlay measuring apparatus 20 to be visualizable to the on-site technicians.

In FIG. 1, the light generated by the light source 130 travels straight along a horizontal direction and does not illuminate the device 30; therefore, a beam splitter 132 capable of directing the light is used to direct the light toward the device 30. The beam splitter 132 can be positioned at an intersection of an optical axis A1 of the light source 130 and an optical axis A2 of one of the optical heads 122 that records the image of the device 30. By the use of the beam splitter 132, the light output from the light source 130 is reflected by the beam splitter 132 and its transmission path is directed toward the device 30; the light reflected off the device 30 may pass through the beam splitter 132 and be transmitted to one of the optical heads 122 that records the image of the device 30. In FIG. 1, the beam splitter 132 is of a cube configuration; however, the beam splitter 132 may have a plate or pellicle configuration.

The imaging assembly 120 can also include a first lens 134 and a second lens 136; the first lens 134 is disposed between the beam splitter 132 and the device 30, and the second lens 136 is disposed between the beam splitter 132 and the optical heads 122. The light reflected by the beam splitter 132 is focused onto the device 30 by the first lens 134, while the light passing through the beam splitter 132 is focused onto the optical head 122 by the second lens 136.

Figure 19:
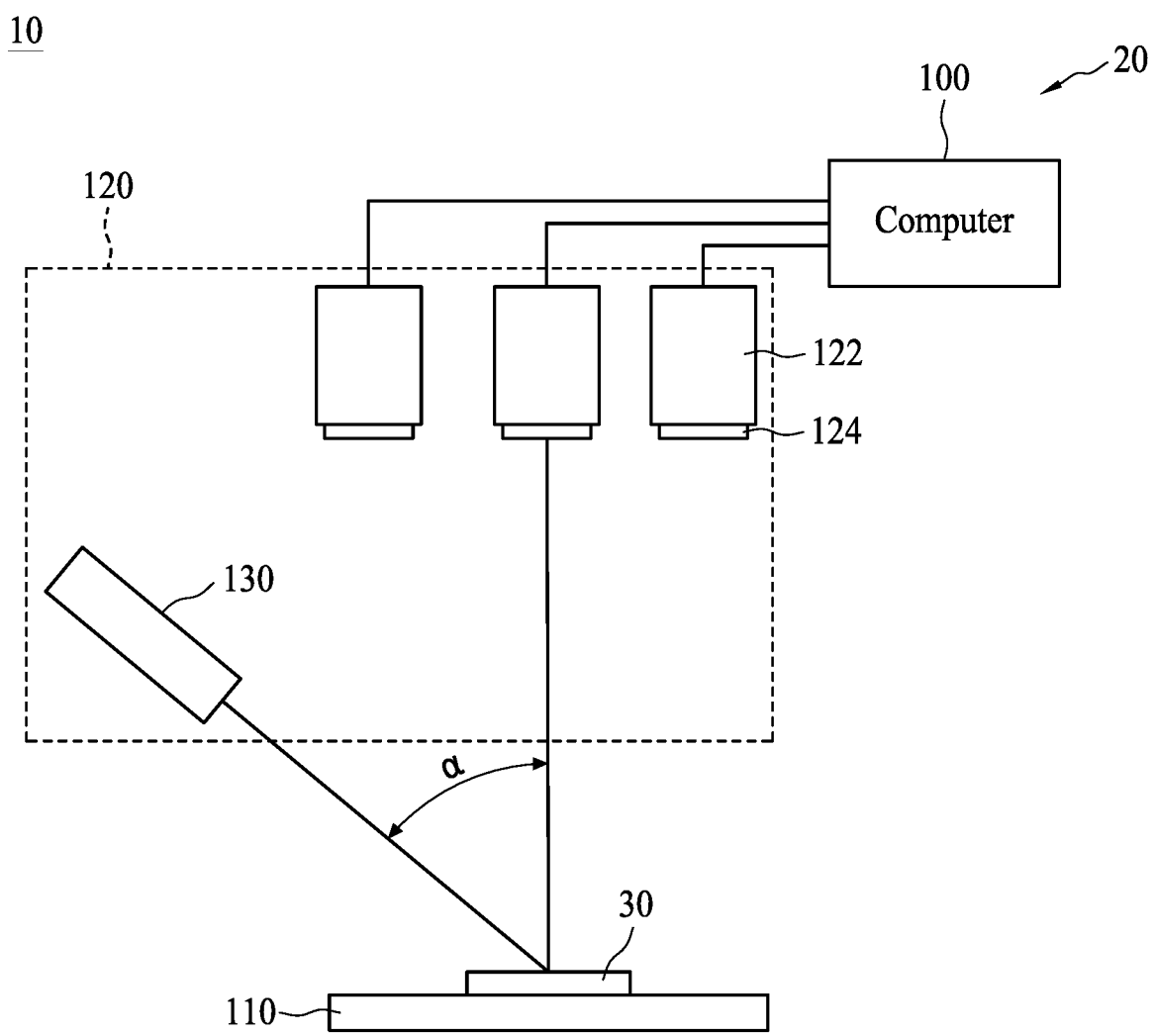
FIG. 19 is a schematic view of an optical system in accordance with some embodiments of the present disclosure.

FIG. 19 is a schematic view of an optical system 10 in accordance with some embodiments of the present disclosure. Referring to FIG. 19, the optical system 10 includes an overlay measuring apparatus 20 and a device 30. The overlay measuring apparatus 20 is used in semiconductor manufacturing processes and used to determine an overlay error of the device 30. The overlay measuring apparatus 20 includes a computer 100, a stage 110 and an imaging assembly 120; the computer 100 is associated with the stage 110 and the imaging assembly 120 and is configured to determine whether the overlay error exists or not.

Figure 20:
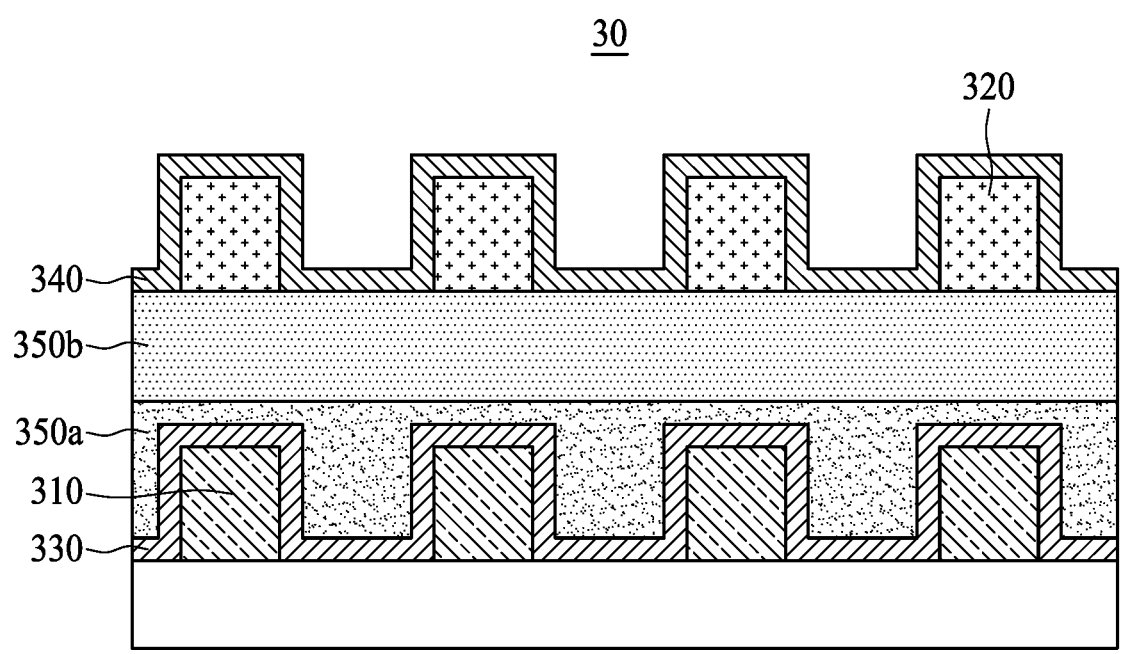
FIG. 20 is a cross-sectional view of a device in accordance with some embodiments of the present disclosure.

FIG. 20 is a cross-sectional view of the device 30 in accordance with some embodiments of the present disclosure. Referring to FIG. 20, the device 30 includes a first patterned layer 310, a second patterned layer 320 disposed above the first patterned layer 310, a first passivation film 330 between the first and second patterned layer 310 and 320, and a second passivation film 340 covering the second patterned layer 320. The first and second passivation films 330 and 340 can provide structural strength to the first and second patterned layers 310 and 320, respectively. In some embodiments, the first and second passivation films 330 and 240 are DLC films or nanocomposite films.

The second patterned layer 320 may include photoresist material and is formed using a lithography process. The second patterned layer 320 may be a pattern, which is used to protect portions of the semiconductor layer 350b during etching. Commonly, overlay errors are checked after an exposure operation. In General, the device having unacceptable overlay error for that particular manufacturing step is reworked by removing and re-depositing the photoresist layer and re-exposed. In some embodiments, the computer 100 may perform data analysis and calculate the overlay error, and then provide various instructions to the on-site technicians via network, such as instructions for adjusting layer formation conditions, or instructions for adjusting lithography conditions in order to eliminate or reduce the overlay error. In some embodiments, the computer 100 may sent instructions to the stage 100 to tune the device 30 tilting, rotating, shifting to reduce the overlay error.

The imaging assembly 120 is used to capture images of the device 30. The device 30 comprises the first and second patterned layer 310 and 320 being measured is placed on the stage 110, which is typically motor driven under control of the computer 100. The computer 100 also performs actual calculations based on data received from the imaging assembly 120. In some embodiments, the computer 100 includes a standardized operation system capable of running general-purpose application software for assisting with the analysis of process performance data and for communicating with the stage 110 and the imaging assembly 120 via communication ports thereof.

The imaging assembly 120 includes a plurality of optical heads 122 and a plurality of overlay marks 124; the optical heads 122 are employed to capture images of the device 30, and the overlay marks 124 are assembled on the optical heads 122. Each of the overlay marks 124 is mounted on the optical heads 122, is optically transparent, and includes a test pattern. The overlay marks 124 may be utilized to measure the alignment of the first patterned layer 310 of the device 30 with respect to the second patterned layer 320 thereof. Additionally, the overlay mark 124 may be utilized to measure the alignment of a first pattern of the device 30 with respect to a second pattern thereof, wherein the first pattern and the second pattern are successive patterns formed on the same semiconductor layer.

The optical head 122 can receive light that is directed to the device 30, reflects off the device 30 and passes through the test pattern of the respective overlay mark 124. The optical head 122 then transforms the received light with predetermined intensity distribution into corresponding electrical signals, and transmits the electrical signals to the computer 100. The computer 100 may execute analysis algorithms that calculate a relative displacement of the patterns on the device 30 based on the captured image(s). The computer 100 can be a desktop computer, a laptop computer or a tablet computer. In addition, the computer 100 and the optical heads 122 can interact using wired links, wireless links, a combination thereof, or any other known or later developed elements that are capable of supplying and/or communicating data to and from the connected computer 100 and the optical heads 122.

Transmission media used as links, for example, can be any suitable carrier for electrical signals, including coaxial cables, copper wire and fiber optics, and may take the form of acoustic or light waves, such as those generated during radio-wave and infrared data communications. The computer 100 may communicate directly with the optical heads 122 over a network; for example, a Wi-Fi network or other local wireless network such as Bluetooth. Alternatively, the computer 100 may also communicate with the optical heads 122 indirectly over a network such as Internet. In some embodiments, the computer 100 may include a computer platform operable to execute applications, which may interact with the optical heads 122.

The light source 130 is adapted to generate light to illuminate the device 30 during performing of the measurement. In FIG. 19, the light generated by the light source 130 is radiated directly toward the device 30, and the light reflected by the device 30 is transmitted to the optical head 122 right above the device 30. That is, an included angle α between an incident light and the reflected light is an acute angle. In some embodiments, the luminance of the light source 130 may be controlled by the computer 100.

Figure 21:
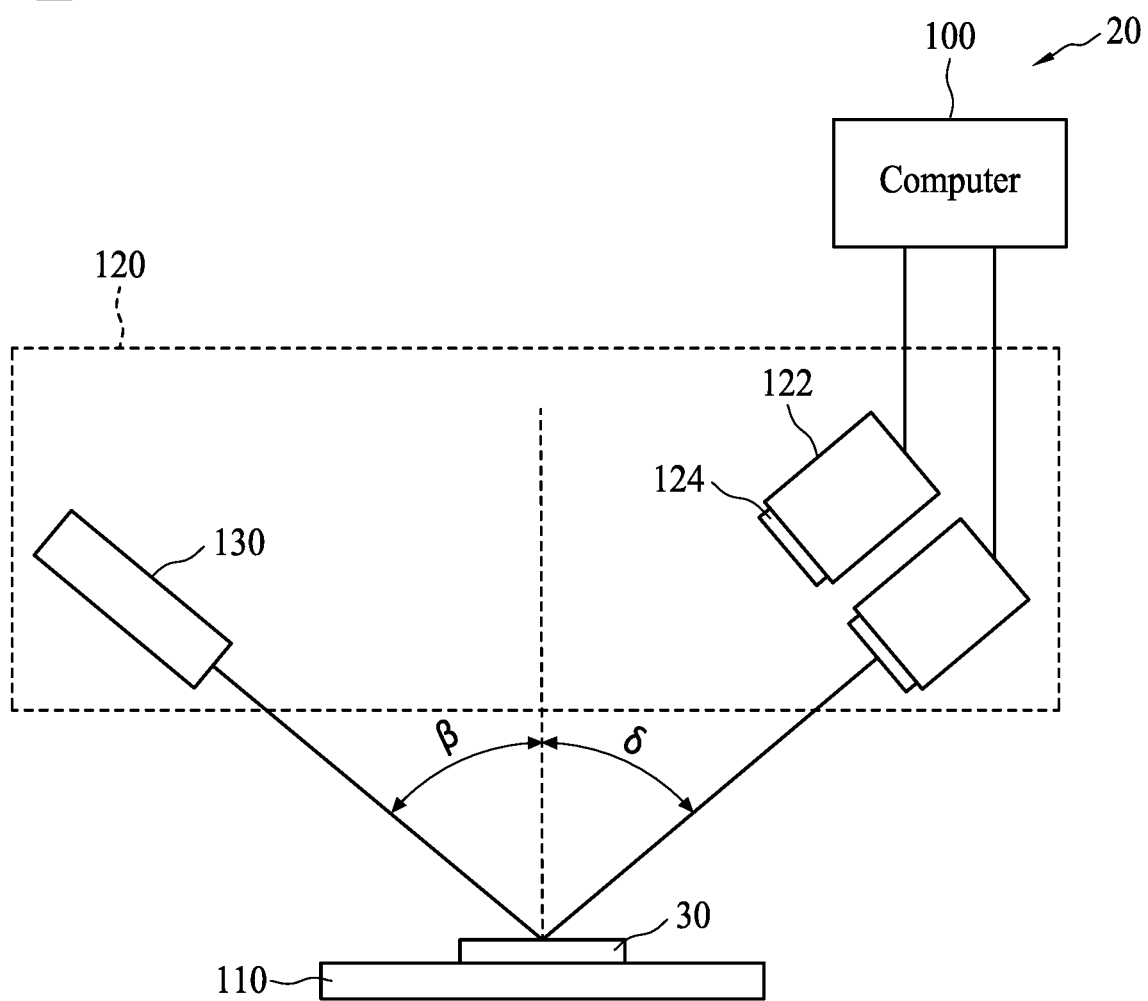
FIG. 21 is a schematic view of an optical system in accordance with some embodiments of the present disclosure.

FIG. 21 is a schematic view of an optical system 10 in accordance with some embodiments of the present disclosure. Referring to FIG. 21, the optical system 10 includes an overlay measuring apparatus 20 and a device 30. The overlay measuring apparatus 20 is adapted to determine whether an overlay error exists in the device 30 or not. The overlay measuring apparatus 20 includes a computer 100, a stage 110 and an imaging assembly 120. The stage 110 and the imaging assembly 120 can be controlled by the computer 100.

The stage 110, holding the device 30 and capable of horizontal motion and vertical motion, is typically motor driven under control of the computer 100. The imaging assembly 120, provided to perform actual measurement with the computer 100, can record images of the device 30 and generate image information to the computer 100. The computer 100 may determine whether the overlay error exists based on the image information. The computer 100 can include a standardized operation system capable of running general-purpose application software for assisting with analysis of process performance data and for communicating with the stage 110 and imaging assembly 120 via communication ports thereof.

The imaging assembly 120 includes a plurality of optical heads 122 employed to record one or more images of the device 30, a plurality of overlay marks 124 mounted on the optical heads 122, and a light source 130 adapted to illuminate the device 30. The overlay marks 124 are mounted on the optical heads 122, are optically transparent, and include test patterns. In some embodiments, the computer 100 can determine whether the overlay error exists using only one test pattern. Alternatively, the computer 100 may determine whether the overlay error exists using the images recorded using different test patterns.

The optical head 122 can receive light projected to the device that is reflected by the device 30 and passes through the respective overlay mark 124. The optical head 122 can further transform the light with predetermined intensity distribution into corresponding electrical signals, and the computer 100 can determine whether the overlay error exists using the electrical signals. In some embodiments, the computer 100 executes analysis algorithms that calculate a relative displacement of patterns on the device 30 based on the captured image(s).

The optical head 122 and the light source 130 are disposed on opposite sides of the device 30. More particularly, an incident angle β of the light emitted from the light source 130 and transmitted to the device 30 is equal to a reflected angle δ of the light reflected from the device 30 and incident onto one of the optical heads 122.

Figure 22:
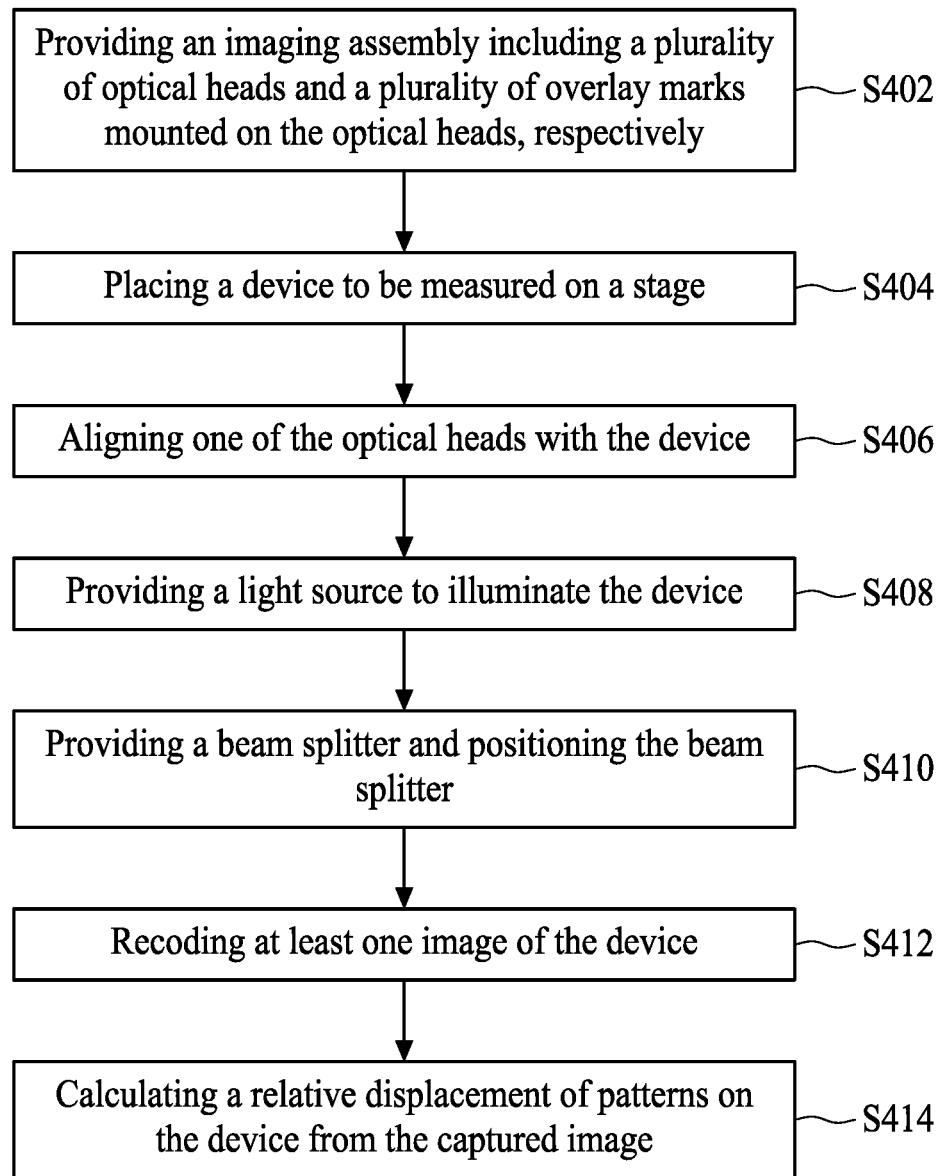
FIG. 22 is a flow diagram illustrating a method of operating overlay measuring apparatus in accordance with some embodiments of the present disclosure.

FIG. 22 is a flow diagram illustrating a method 400 of operating overlay measuring apparatus in accordance with some embodiments of the present disclosure. Referring to FIGS. 1 and 22, the method of operating overlay measuring apparatus can begin at step S402, in which an imaging assembly 120 is provided. The imaging assembly 120 includes a plurality of optical heads 122 adapted to record one or more image of a device 30 and a plurality of overlay marks 124 mounted on the optical heads 122.

The method then proceeds to a step S404, in which the device 30 to be measured is placed on a stage 110. The device 30 includes two or more successive patterned layers. The patterned layers of the device may be formed during front-end-of-line (FEOL) processes or back-end-of-line (BEOL) processes. After the device 30 is set, one of the optical heads 122 adapted to capture one or more images is aligned with the device 30 (step S406). The optical head 122 and the device 30 may be aligned in accordance with instructions provided by a computer 100 programmed to control operation of the stage 110 and the optical heads 122. During the alignment, the computer 100 may drive the stage 110 to align the one of the optical heads 122. Alternatively, the computer 100 may drive the optical heads 122 for recording the image to align with the stage 110.

After the optical head 122 and the device 30 are aligned, the optical head 122 can start to record the image(s) of the device 30 (step S412). The optical head 122 may transform the recorded images into corresponding electrical signals and transmit the electrical signals to the computer 100. The computer 100 can determine whether an overlay error exists or not, and can determine a relative displacement of patterns formed on layers of the device 30 based on the electrical signals (step S414).

The computer 100 and the optical heads 122 can interact using wired links, wireless links, a combination thereof, or any other known or later developed elements that are capable of supplying and/or communicating data to and from the connected computer 100 and the optical heads 122. Transmission media used as links, for example, can be any suitable carrier for electrical signals, including coaxial cables, copper wire and fiber optics, and may take a form of acoustic or light waves, such as those generated during radio-wave and infrared data communications. The computer 100 may communicate directly with the optical heads 122 over a network; for example, a Wi-Fi network or other local wireless network such as Bluetooth. Alternatively, the computer 100 may also communicate with the optical heads 122 indirectly over a network such as Internet. In some embodiments, the computer 100 may include a computer platform operable to execute applications, which may interact with the optical heads 122.

Material property factors that influence the quality of the image including reflectivity, refractive index, surface roughness, and thickness. Process conditions such as shadowing and light wavelength can also influence signal quality. Thus, if the measurement is conducted in an environment where background light is insufficient, a light source 130 can be optionally provided to illuminate the device 30 before the recording of the device 30 (step S408). Incident light angle may influence image quality; therefore, other optical components, including a beam splitter 132, may be optionally provided to modify an optical path of the light generated by the light source 130, reflected by the device 30 and transmitted to the optical head 122 (step 410). Specifically, the beam splitter 132 is positioned at an intersection of an axis A1 of the light source 130 and an axis A2 of the optical head 122 recording the image(s) of the device 30. In some embodiments, the light generated by the light source 130 is radiated directly toward the device 30. In some embodiments, an aperture stop or spatial light modulator (not shown) may be provided in the illumination path to control a range of angle of incidence of light on the device 30.

In conclusion, with the configuration of the overlay measuring apparatus 20, the test pattern of the overlay mark 124 is mounted on the optical head 122 and is replaceable during the measurement; therefore, the recorded image may have a better resolution, and thus the accuracy of the measurement is improved.

One aspect of the present disclosure provides an overlay measuring apparatus for determining relative positions of two or more successive patterned layers of a device. The overlay measuring apparatus comprises a stage and an optical assembly configured to capture images of the device placed on the stage. The optical assembly comprises a plurality of optical heads for recording images of the device and a plurality of overlay marks mounted on the optical heads. The relative positions of the two or more successive patterned layers of the device are determined using light reflecting off the device and passing through the overlay mark mounted on the respective optical head employed to record the images of the device.

One aspect of the present disclosure provides an optical system. The optical system comprises a device and an overlay measuring apparatus. The device includes a first patterned layer, a second patterned layer above the first patterned layer, and a first passivation film covering the first patterned layer. The overlay measuring apparatus for determining relative position of first and second patterned layers includes a stage and an imaging assembly. The device is placed on the stage. The imaging assembly comprises a plurality of optical heads and a plurality of overlay marks. The plurality of optical heads are configured to record at least one image of the device. The plurality of overlay marks are assembled on the plurality of optical heads, respectively. The relative position of the first and second patterned layers are determined using light reflected from the device and passing through the respective overlay mark mounted on the optical head.

One aspect of the present disclosure provides a method of operating overlay measuring apparatus. The method comprises steps of providing a plurality of optical heads; assembling a plurality of overlay marks on the plurality of optical heads, respectively; placing a device to be measured on a stage; aligning one of the plurality of optical heads with the device; and recording at least one image of the device.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. An overlay measuring apparatus for determining relative positions of two or more successive patterned layers of a device, the overlay measuring apparatus comprising:
    a computer;
    a stage where the device is placed; and
    an imaging assembly, comprising:
       a light source configured to generate light to illuminate the device;
       a plurality of optical heads positioned above the stage and configured to record at least one image of the device in the computer, wherein the computer controls a revolving of each of the optical heads;
       a plurality of overlay marks directly and replaceably assembled on the plurality of optical heads, respectively, wherein the overlay marks are driven to revolve via the revolving of the optical heads when the optical heads are revolved by the computer, wherein when one of the optical heads is selected to align with the device, the relative positions of the successive patterned layers of the device are determined using light reflected from the device and passing through the respective overlay mark mounted on the optical head, such that each of the optical heads receives the light through the respective overlay mark, wherein the overlay marks are detachably mounted at bottom sides of the optical heads respectively for measuring an alignment between the successive patterned layers; and
    a beam splitter disposed at an intersection of axes of the light source and one of the optical heads and between the stage and the overlay mark at the bottom side of one of the optical heads.

2. The overlay measuring apparatus of claim 1, wherein the computer is configured to execute algorithms that calculate a relative displacement of the successive patterned layers using electrical signals transferred from the image recorded by the optical head, wherein one of the optical heads is controlled by the computer for aligning with the device to enable the light passing through the corresponding overlay mark at the optical head.

3. The overlay measuring apparatus of claim 2, wherein the computer analyzes a difference between a predetermined intensity distribution of light reflected by the device and a unique intensity distribution of light reflected by the device and passing through the respective overlay mark, in order to obtain the relative displacement of the patterned layers on the device.

4. The overlay measuring apparatus of claim 2, wherein the computer is configured to control a movement of the stage to align one of the optical lens with the device and is configured to select the optical head to record the image.

5. The overlay measuring apparatus of claim 1, wherein the light source is controlled by the computer to provide the light at selective wavelengths.

6. The overlay measuring apparatus of claim 5, wherein the beam splitter reflects the light generated from the light source, and the light reflected from the device passes through the beam splitter and the respective overlay mark and is incident onto the respective optical head.

7. The overlay measuring apparatus of claim 6, further comprising:
    a first lens between the beam splitter and the device, wherein the light is reflected by the beam splitter is focused onto the device by the first lens; and
    a second lens between the beam splitter and the overlay mark at the bottom side of one of the optical heads, wherein the light passing through the beam splitter is focused onto one of the optical heads by the second lens.

8. The overlay measuring apparatus of claim 1, wherein the overlay mark comprises a plurality of micro-structures arranged in a concentric configuration.

9. The overlay measuring apparatus of claim 8, wherein the micro-structures include circles.

10. The overlay measuring apparatus of claim 8, wherein the micro-structures include squares.

11. The overlay measuring apparatus of claim 10, wherein the micro-structures further comprise two lines intersecting at a center of the squares and dividing the squares into quarters.

12. The overlay measuring apparatus of claim 8, wherein the micro-structures include rhombuses.

13. The overlay measuring apparatus of claim 12, wherein the micro-structures further comprise four lines extending outward from centers of sides of an outermost one of the rhombuses.

14. The overlay measuring apparatus of claim 12, wherein the micro-structures further comprise a plurality of lines spaced apart from an outermost one of the rhombuses with a first pitch greater than a second pitch between two of the rhombuses adjacent to each other.

15. The overlay measuring apparatus of claim 1, wherein the overlay mark is composed of repetitious micro-structures.

16. The overlay measuring apparatus of claim 15, wherein the overlay mark is a rhombus and is composed of a plurality of rhomboidal micro-structures.

17. The overlay measuring apparatus of claim 15, wherein the micro-structures are rectangular and are arranged in a running bond configuration.

18. The overlay measuring apparatus of claim 15, wherein the overlay mark comprises rhomboidal or hexagonal micro-structures.

19. The overlay measuring apparatus of claim 15, wherein the micro-structures have a gammadion shape.

20. The overlay measuring apparatus of claim 1, wherein the overlay mark comprises a plurality of trapezoidal micro-structures and a plurality of inverted trapezoidal micro-structures alternately interlaced with each other.

21. The overlay measuring apparatus of claim 1, wherein the overlay mark comprises zigzag micro-structures.

22. The overlay measuring apparatus of claim 1, wherein the overlay mark comprises multiple overlapping square micro-structures, and each of the overlapping square micro-structures is composed of four small squares.

* * * * *